(12) United States Patent
Cheng et al.

(10) Patent No.: US 7,749,038 B2
(45) Date of Patent: Jul. 6, 2010

(54) LIGHT EMITTING DEVICE FABRICATION METHOD

(75) Inventors: Wei-Yuan Cheng, Taipei County (TW); Yu-Chao Wu, Taipei County (TW)

(73) Assignee: Hong-Yuan Technology Co., Ltd., Yonghe (TW)

( * ) Notice: Subject to any disclaimer, the term of this patent is extended or adjusted under 35 U.S.C. 154(b) by 1325 days.

(21) Appl. No.: 11/059,554

(22) Filed: Feb. 17, 2005

(65) Prior Publication Data

US 2005/0184651 A1 Aug. 25, 2005

(30) Foreign Application Priority Data

Feb. 19, 2004 (TW) ............................... 93104058 A

(51) Int. Cl.
- H01J 1/63 (2006.01)
- H01J 63/08 (2006.01)
- C09K 11/02 (2006.01)
- H05B 33/14 (2006.01)

(52) U.S. Cl. ........................ 445/24; 445/25; 313/503; 313/512; 257/434

(58) Field of Classification Search ......... 313/501–512; 445/24–25; 427/66
See application file for complete search history.

(56) References Cited

U.S. PATENT DOCUMENTS

| | | | |
|---|---|---|---|
| 5,032,472 A * | 7/1991 | Michel et al. ............... | 428/704 |
| 5,096,735 A * | 3/1992 | Nakaya et al. .............. | 427/573 |
| 5,885,492 A | 3/1999 | Lee et al. | |
| 6,120,338 A * | 9/2000 | Hirano et al. ................ | 445/24 |
| 6,576,488 B2 | 6/2003 | Collins, III et al. | |
| 6,642,618 B2 | 11/2003 | Yagi et al. | |
| 6,642,652 B2 | 11/2003 | Collins, III et al. | |
| 6,650,044 B1 * | 11/2003 | Lowery ...................... | 313/502 |
| 6,686,581 B2 | 2/2004 | Verhoeckx et al. | |
| 6,858,869 B2 | 2/2005 | Fujiwara | |
| 6,882,383 B1 * | 4/2005 | Su .............................. | 349/69 |
| 7,422,504 B2 | 9/2008 | Maeda et al. | |
| 2002/0109456 A1 * | 8/2002 | Morii et al. ................. | 313/504 |
| 2003/0181122 A1 * | 9/2003 | Collins et al. ............... | 445/24 |
| 2004/0079955 A1 * | 4/2004 | Furukawa et al. ........... | 257/98 |
| 2004/0119068 A1 * | 6/2004 | Weaver ...................... | 257/40 |
| 2004/0156982 A1 * | 8/2004 | Maruyama et al. .......... | 427/58 |
| 2004/0209126 A1 * | 10/2004 | Ziegler et al. .............. | 428/702 |
| 2005/0129977 A1 * | 6/2005 | Poon et al. .................. | 428/690 |
| 2006/0061272 A1 * | 3/2006 | McCormick et al. ........ | 313/512 |

FOREIGN PATENT DOCUMENTS

| | | |
|---|---|---|
| CN | 2300189 Y | 12/1998 |
| CN | 1411614 | 4/2003 |
| CN | 1461061 A | 3/2006 |
| JP | 61-131860 | 8/1986 |

(Continued)

Primary Examiner—Sikha Roy
Assistant Examiner—Tracie Green
(74) Attorney, Agent, or Firm—Liu & Liu

(57) ABSTRACT

A light emitting device fabrication method. The fabrication method of the light emitting device comprises providing a light emitting semiconductor device; positioning a plurality of luminescent particles at the optical path of the light emitting semiconductor device; and reducing the distance between the luminescent particles to enhance the molecular attraction between the luminescent particles, than the luminescent particles is coagulated to a luminescent powder layer by the molecular attraction.

20 Claims, 10 Drawing Sheets

FOREIGN PATENT DOCUMENTS

| | | |
|---|---|---|
| JP | 64-5079 | 1/1989 |
| JP | 11040858 A | 12/1999 |
| JP | 2000150966 A | 5/2000 |
| JP | 2001-111109 A | 4/2001 |
| JP | 2003-101074 A | 4/2003 |
| TW | 90104862 B | 2/2003 |

\* cited by examiner

LIGHT EMITTING DEVICE FABRICATION METHOD

BACKGROUND

The invention relates to a light emitting device and fabrication method thereof, and more particularly to a luminescent powder layer for the light emitting device and fabrication method thereof.

Light emitting diodes (LEDs) have high brightness, low volume, low power consumption and long life and such as, are used in variety of display products. The luminescent principle of LED is as follows. A voltage is applied to a diode to drive an electron and hole combination. The combination releases light from the diode. Furthermore, phosphors can be added into the LED to tune the luminescent wavelength (color) and luminescent intensity of the light.

White LEDs can be used in the lighting field. There are two white LED structures. One is single chip LED. This LED uses a single LED chip and phosphors to obtain white light. For example, a white LED can use a blue LED chip and yellow phosphors or use a UV LED chip, blue, green and red phosphors to obtain a white LED. Another white LED uses a multiple chip LED. This LED uses a plurality of LED chips and phosphors to obtain white light. For example, a white LED can use blue, green and red LED chips to obtain white LED. But the multiple chips LED has a plurality of LED chips, wherein have different driving voltages, luminescent intensity, temperature characteristics and lifetime. Thus, the LED design is more complicated and has higher cost. Accordingly, the single chip LED is more practical.

The simpler structure of the single chip LED uses single LED chip and phosphors to obtain white light. In the FIG. 1, the LED comprises a pair of electrodes 10, electrically contacting a lead frame 11. LED 12, as GaN, is disposed in the lead frame 11, adhesive 13, comprising epoxy or gel, is provided in the lead frame 11 covering the LED 12. Phosphors 14, comprising YAG, are dispersed in the adhesive 13. Finally, the LED is packaged by package materials 15.

In the above LED, the YAG is mixed into the resin then coated on the blue GaN LED chip. This method, contrary, is time and material inefficiently, and the LED luminescent efficiency and uniformity decrease due to the resin absorption and the bad YAG dispersion.

Furthermore, U.S. Pat. No. 6,642,618 disclosed that the phosphors are mixed into the glass layer to prevent the humidity insertion. The YAG, however, may not be well mixed, so that the LED luminescent efficiency and uniformity may decrease.

U.S. Pat. No. 6,576,488 and U.S. Pat. No. 6,686,581 disclosed that the phosphors structure is formed on the LED chip surface by electrophoresis. The phosphor powders must be conversed to gel via charges and then formed by electrical field by applying voltage. A conductive plate must be added on the LED chip surface to attract phosphors to adhere thereto.

U.S. Pat. No. 6,650,044 disclosed that the phosphor structure is formed on the LED chip surface by a screen printing method. In the screen printing method, the stencil is fabricated first, and solidifying agent most be added to the phosphor powders to solidify the phosphor powders on the LED chip surface.

U.S. Pat. No. 6,650,044 disclosed a LED structure by the above-mentioned technology.

Taiwanese Application No. 90,104,862 disclosed that the luminescent material is adhered to the semiconductor device by adhesive.

In these known technologies, the phosphors structure is formed on the LED chip surface by adhesive or electrophoresis only.

SUMMARY

Accordingly, embodiments provide a light emitting diode device and fabrication method thereof.

Embodiments provide a light emitting device fabrication method, comprising: providing a light emitting semiconductor wafer; defining an optical path zone corresponding to the light emitting semiconductor wafer; and forming a luminescent powder layer over the optical path zone.

DESCRIPTION OF THE DRAWINGS

For a better understanding of the invention, reference is made to a detailed description to be read in conjunction with the accompanying drawings, in which.

DETAILED DESCRIPTION

In order to understand the above and other objects, characteristics and advantages, preferred embodiments of the invention are now described detail in with reference to the attached figures.

Embodiments disclose a LED device fabrication method for providing a light emitting semiconductor wafer; defining an optical path zone of the light emitting semiconductor wafer; and forming a luminescent powder layer over the optical path zone.

To obtain the above method, one embodiment comprises the steps following: dispersing a plurality of luminescent particles in a liquid to form a mixture; positioning a substrate in the mixture for a period, until the luminescent particles deposit on the substrate; and removing the liquid to coagulate the luminescent particles on the substrate and adhere the luminescent particles to the substrate.

The luminescent particle density is higher than the liquid density for the luminescent particle deposition. The luminescent particle density is about 0.001~1 g/ml, preferably 0.01~0.15 g/ml. The luminescent particle size is about 0.1~100 μm. For example, the phosphor average particle size is about 3~13 μm. Furthermore, the nano-scale luminescent particles may be used in the present embodiment. The luminescent particles are barely soluble or insoluble in the liquid.

The substrate may be a light emitting semiconductor device, such as a LED chip, or layers consisting of the LED chip.

The follow embodiments give the LED as an example to illustrate the structure.

Led

Figure 1:
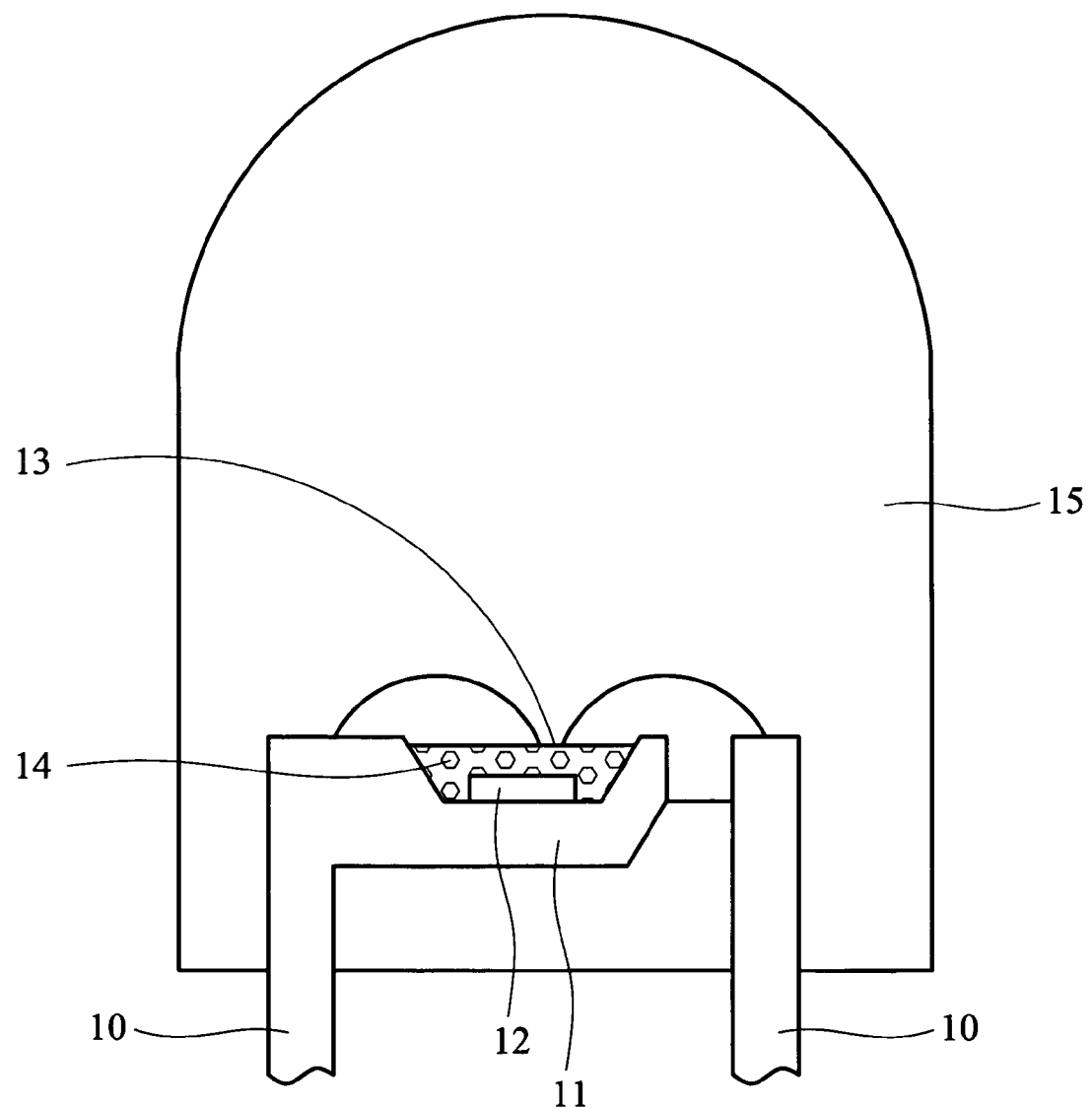
FIG. 1 is a cross-section showing the convention LED structure.
Figure 2A:
FIG. 2A is a cross-section showing an embodiment of a LED structure.
Figure 2B:
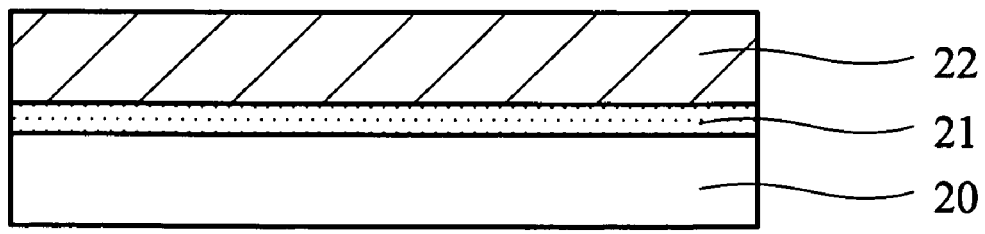
FIG. 2B is a cross-section showing another embodiment of a LED structure.

FIG. 2 is a LED cross-section in an embodiment. The LED comprises substrate 20 and luminescent powder layer 21. The luminescent powder layer 21 is directly adhered on the substrate 20. The luminescent powder layer 21 is free of epoxy, glue, or similar. In FIG. 2B, the passivation layer 22 can also be formed on the luminescent powder layer 21 to protect the luminescent powder layer 21. The passivation layer 22 can be a polymer layer.

Figure 3A:
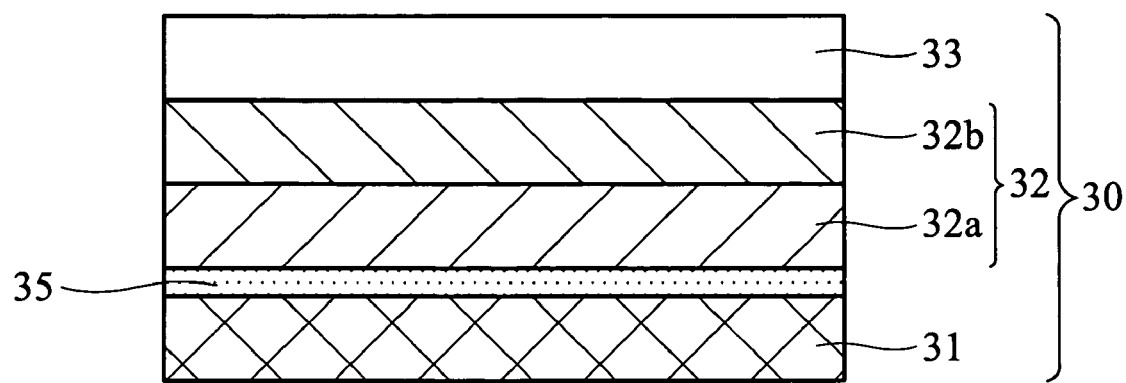
FIG. 3A is a cross-section showing a further embodiment of a LED structure.

FIG. 3A is another LED cross section in an embodiment. The LED comprises the LED chip 30 and the luminescent powder layer 35. The LED chip 30 comprises substrate 31, a plurality of semiconductor layers 32 and the conductive layer 33. The conductive layer 33 may be conductive glass layer, such as an ITO layer. The plurality of semiconductor layers 32 may be two layers or more than two layers. In this case, the plurality of semiconductor layers 32 are two layers, the first semiconductor layer 32a and the second semiconductor layer 32b, in the FIG. 3A. The luminescent powder layer 35 may be adhered on the substrate 31 surface directly. The emitting powder layer 35 also may be adhered on either the plurality of semiconductor layer 32 surfaces or the conductive layer surface, such as on the first semiconductor layer 32a surface, the second semiconductor layer 32b surface or the conductive layer 33 surface. The luminescent powder layer 35 only consists of luminescent powders, free from any adhesive, such as epoxy or glue, etc.

Figure 3B:
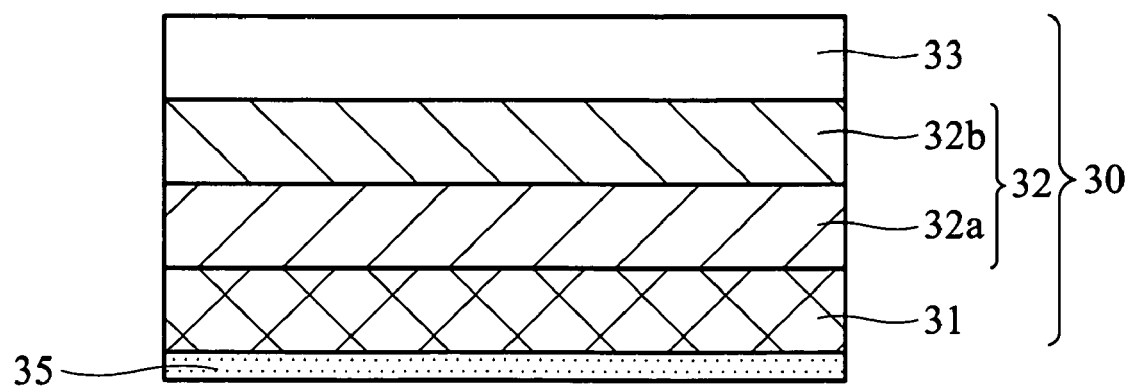
FIG. 3B is a cross-section showing yet another embodiment of a LED structure.

FIG. 3B is another LED cross-section in an embodiment. The LED structure is similar to the LED in FIG. 3A. The difference is that the emitting powder layer 35 is provided on bottom surface of the substrate 31. This LED structure may be used in the flip chip fabrication.

The luminescent powder layer 21 and 35 may be phosphors, such as sulfide phosphors or non-sulfide phosphors. The sulfide phosphors may be covered by a coating film, such as organic polymer coating film, to prevent environmental factors, such as humidity and oxygen. The non-sulfide phosphors may be YAG, TAG or any other phosphor.

Furthermore, a passivation may be formed on the luminescent powder layer to avoid external influence and contamination. The passivation may be organic polymer materials.

The following embodiments describe the light emitting semiconductor chips with optical path zone and non-optical path zone structures.

Light Emitting Device

Figure 6A:
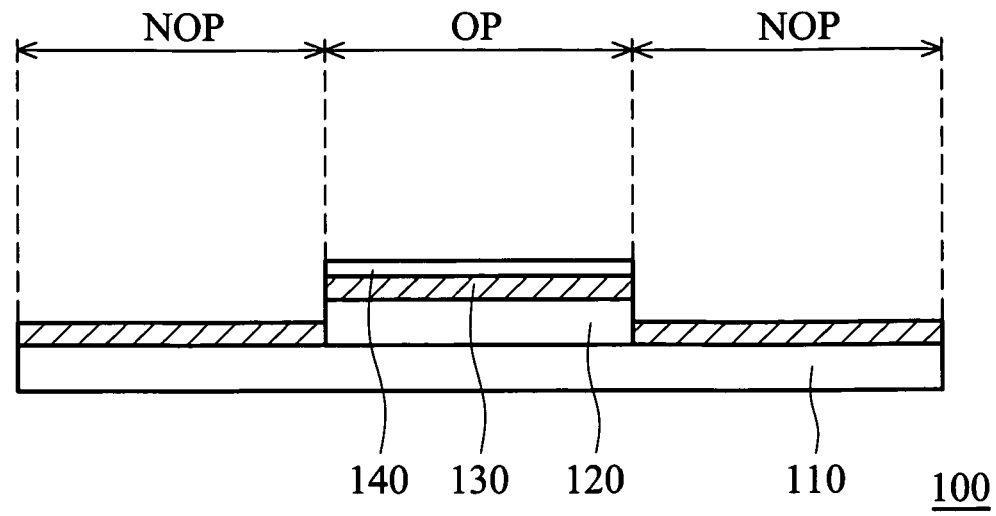
FIG. 6A is a cross-section showing an embodiment of a LED package structure with a first passivation.
Figure 6B:
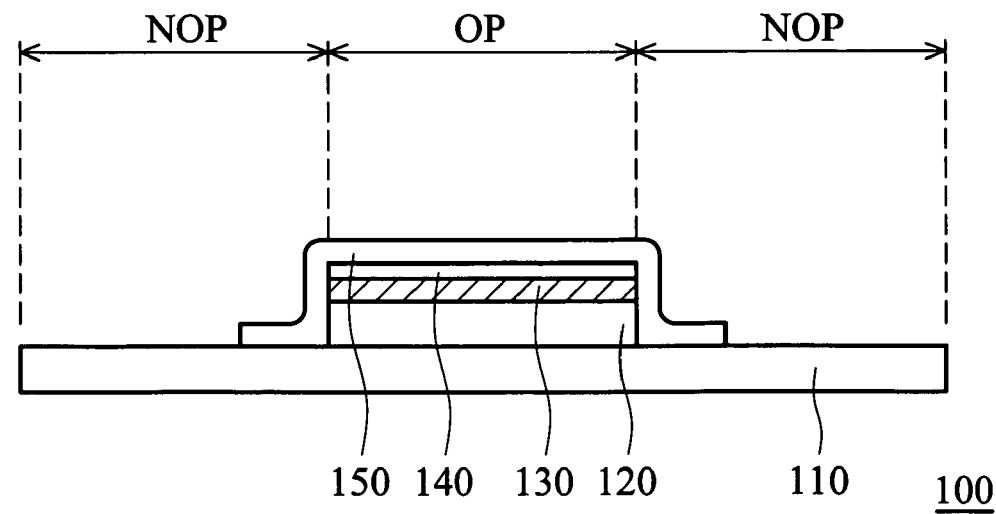
FIG. 6B is a cross-section showing an embodiment of a LED package structure with a second passivation.

Referring to FIG. 6B, a light emitting device comprises the light emitting semiconductor device 100 and the luminescent powder layer 130. The light emitting semiconductor device 100 may be chip or wafer. In the present embodiment, the light emitting semiconductor device 100 is the wafer 110 with a plurality of chips 120. The wafer 110 may be separated into an optical path zone OP and a non-optical path zone NOP.

The luminescent powder layer 130 is adhered on the surface of the chip 120 or the optical path zone OP. At least a portion, the main portion or the entire the luminescent powder layer 130 is coagulated and free of adhesive. In the present embodiment, the luminescent powder layer 130 consists of phosphors, and is coagulated by intermolecular attraction. Thus, the luminescent powders do not comprise adhesive, such as resin, organic polymer, solidify materials, or glass gel.

In one example, the first passivation layer 140 is formed on the luminescent powder layer 130 to avoid scraping, and the passivation 140 at least covers the top surface of luminescent powder layer 130. Secondly, the second passivation 150 at least covers the first passivation 140 and the luminescent powder layer 130, and may cover the chip 120. The thickness of the second passivation 150 may be higher than the first passivation 140. In an embodiment, first passivation layer 140 may be a stress buffer layer to avoid damage to the powder layer in subsequent thermal treatments. The stress buffer layer comprises softer materials, such as silicon gel. The second passivation 150 is a layer comprising harder material, such as epoxy, to avoid scraping or crushing.

The luminescent powders comprise sulfide phosphors and non-sulfide phosphors, the non-sulfide phosphors are used in the present embodiment. The embodiments of the light emitting semiconductor device are shown in FIG. 3A and FIG. 3B.

Light Emitting Package Structure

Figure 4A:
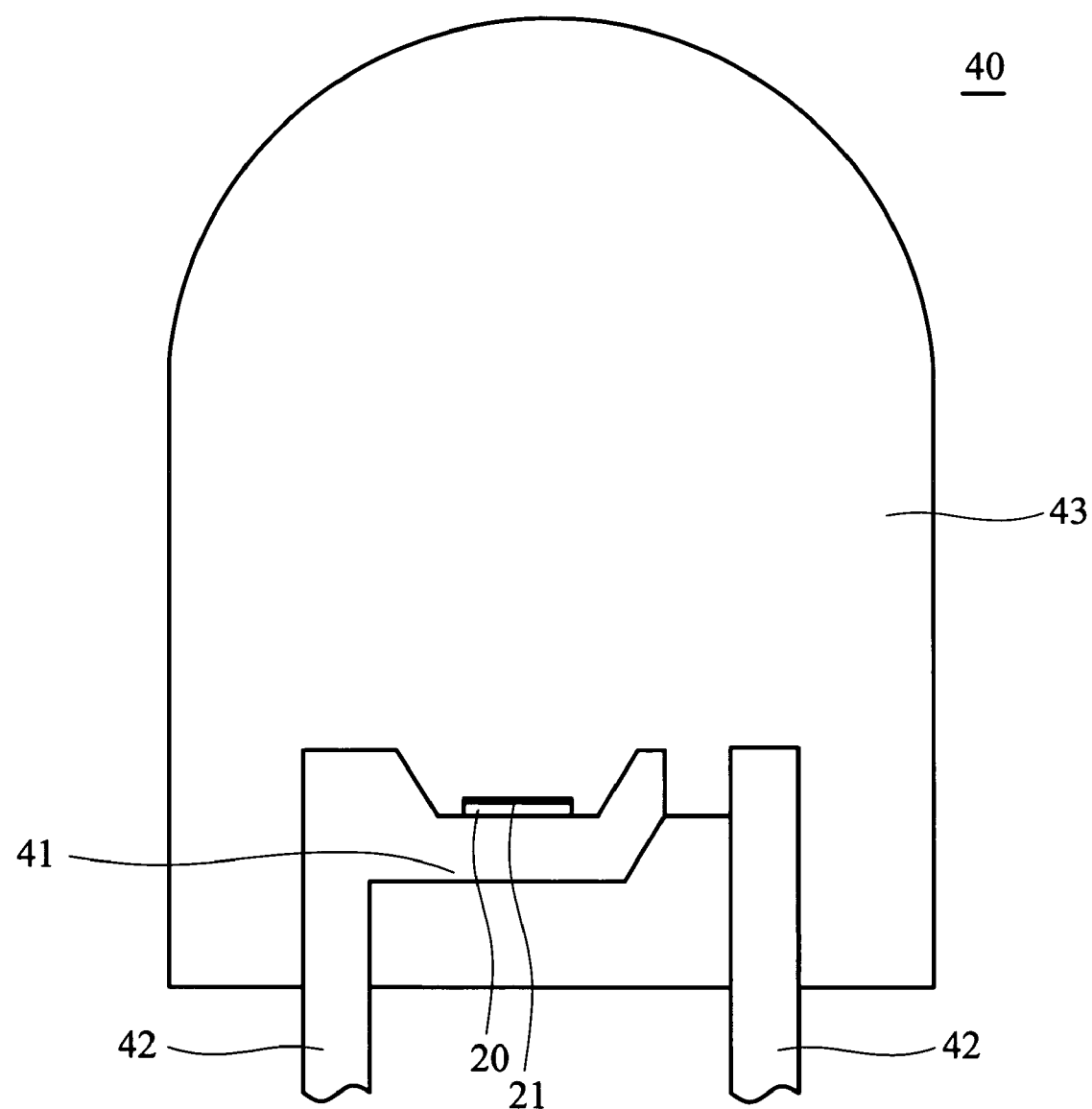
FIG. 4A is a cross-section showing an embodiment of a LED package structure.
Figure 4B:
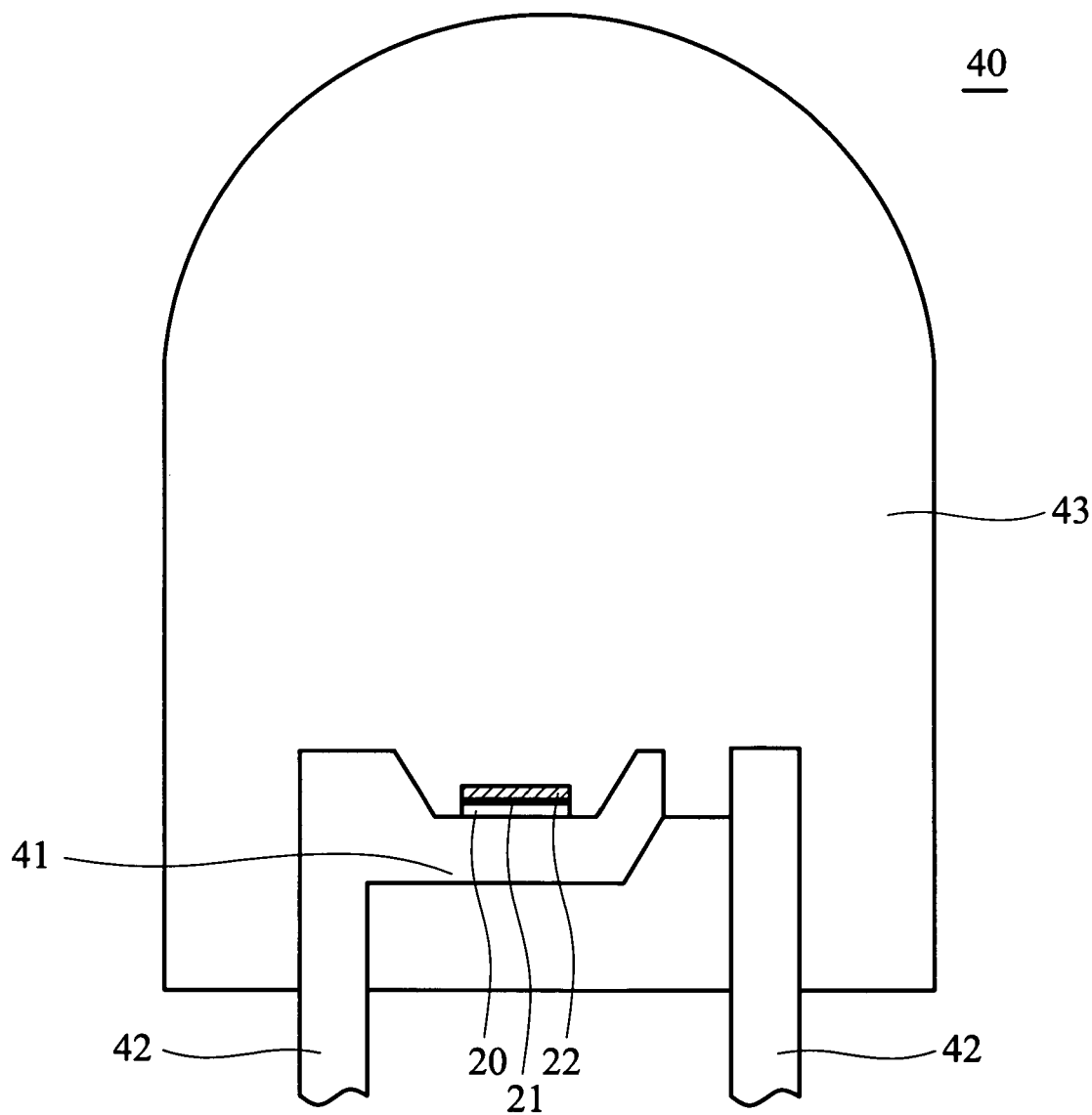
FIG. 4B is a cross-section showing another embodiment of a LED package structure.

FIG. 4A is the cross section of the light emitting package structure of the invention. In the present embodiment, the light emitting semiconductor device is LED 40. First, the LED as shown in FIG. 2 is put in the lead frame 41, the lead frame 41 contacts a pair of electrodes 42 electrically. The lead frame 41, substrate 20 and the luminescent powder layer 21 are packaged by the package materials 43. Furthermore, the passivation 22 may be formed on the luminescent powder layer 21 to protect the luminescent powder layer 21. The passivation 22 may comprise a polymer layer or epoxy.

Figure 5:
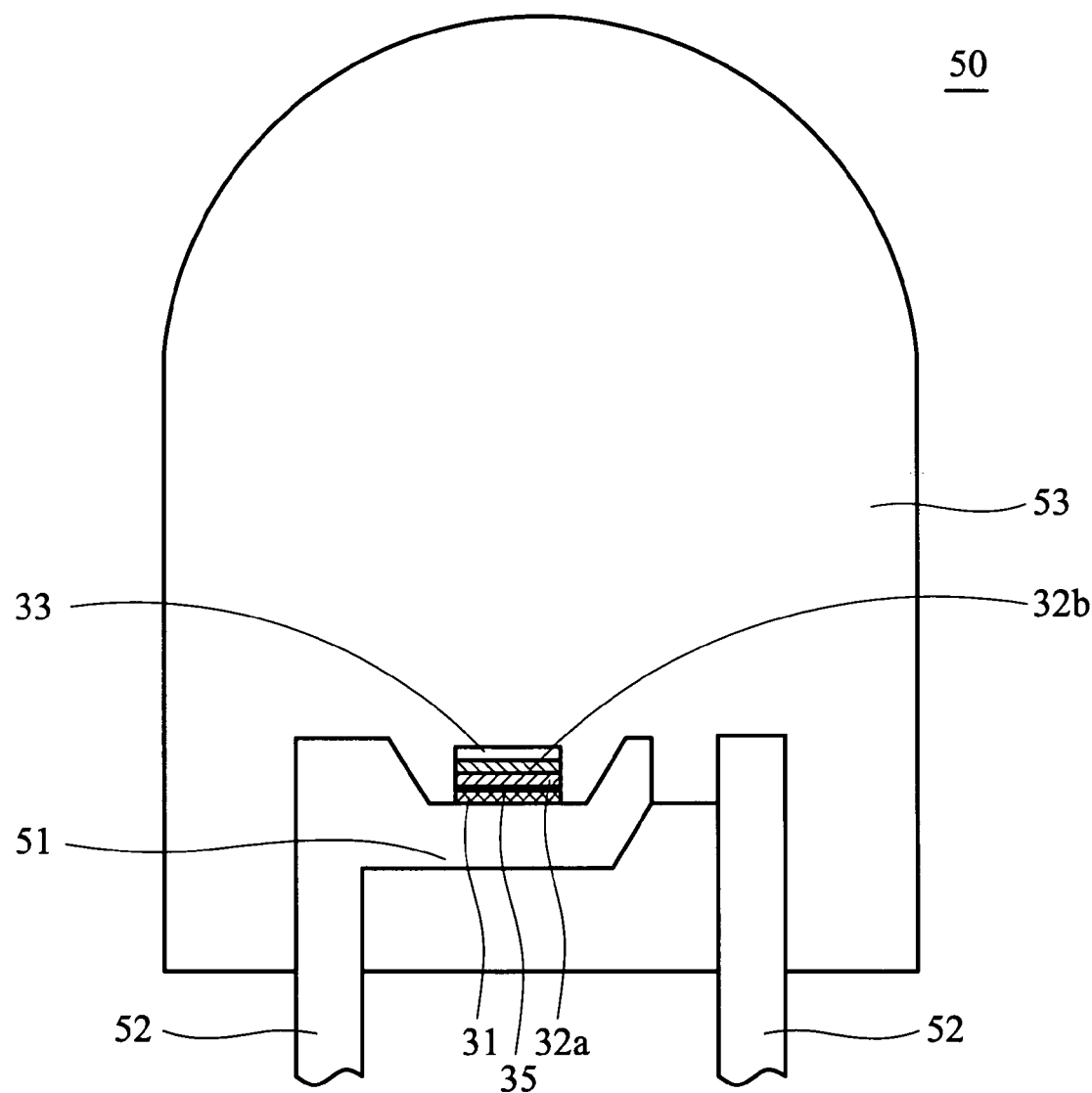
FIG. 5 is a cross-section showing a further embodiment of a LED package structure.

FIG. 5 is the cross section of another light emitting package structure in one embodiment. The LED as shown in FIG. 3A is disposed in the lead frame 51, the lead frame 51 contacts a pair of electrodes 52 electrically. The lead frame 51, the light emitting chip 30 and the luminescent powder layer 35 are packaged by package materials 53.

The light emitting device may be used in the other package structures, such as flip chip structure.

Light Source

Figure 7:
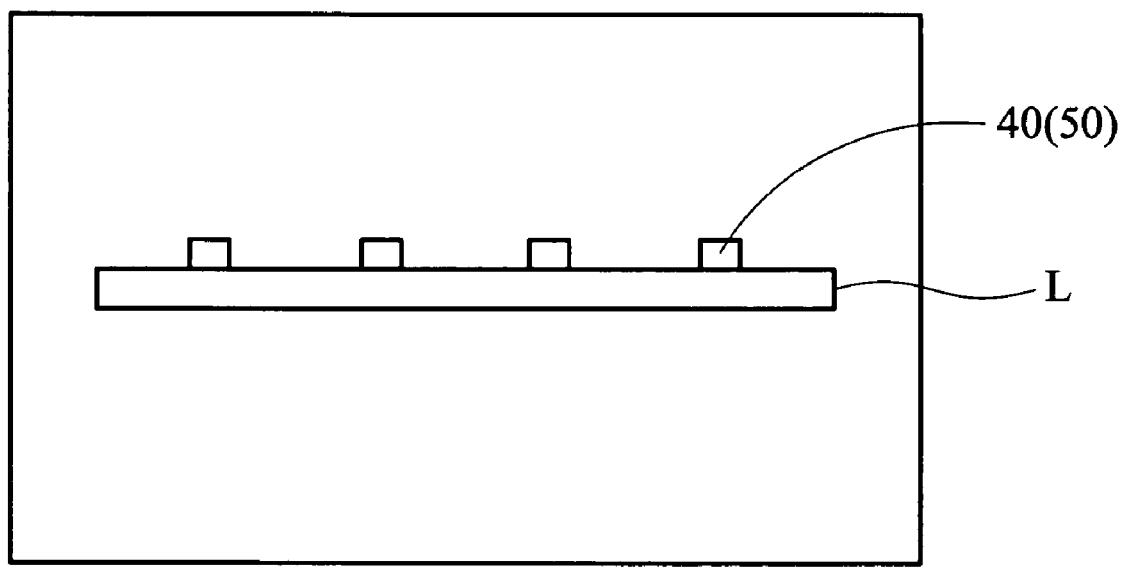
FIG. 7 is a cross-section showing an embodiment of a light source structure.

Referring to FIG. 7, the light emitting device 40 (50) electrically contacts the circuit board L to form the light source 200.

Back Light Module

Figure 8A:
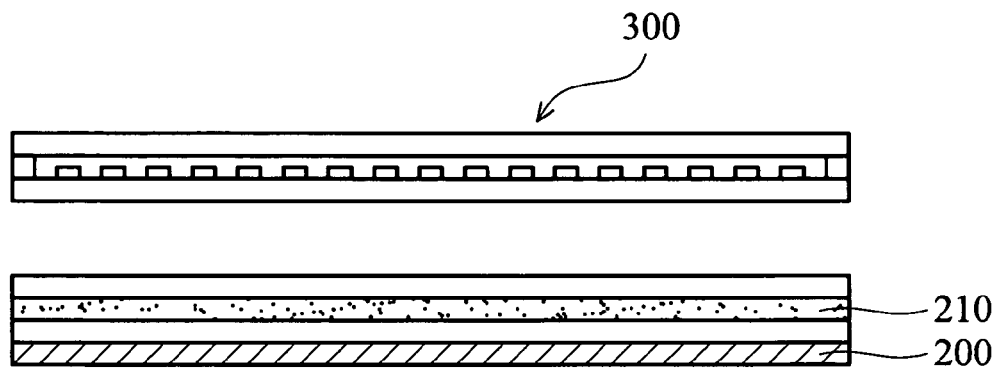
FIG. 8A is a cross-section showing an embodiment of a display device.
Figure 8B:
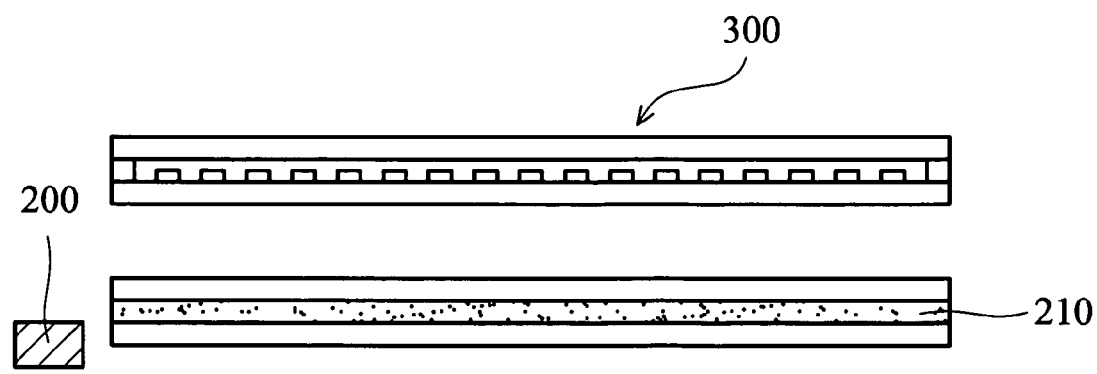
FIG. 8B is a cross-section showing another embodiment of a display device.

Referring to FIGS. 8A and 8B, the light source 200 is disposed under the module body 210 or on the module body 210 sidewall to output light.

Display Device

FIGS. 8A and 8B show a display element 300. The light source or the back light module provides the light source to the display element 300 to form a display device.

The following illustrates the fabrication method and system for the above device.

Fabrication System for Light Emitting Device

Figure 9:
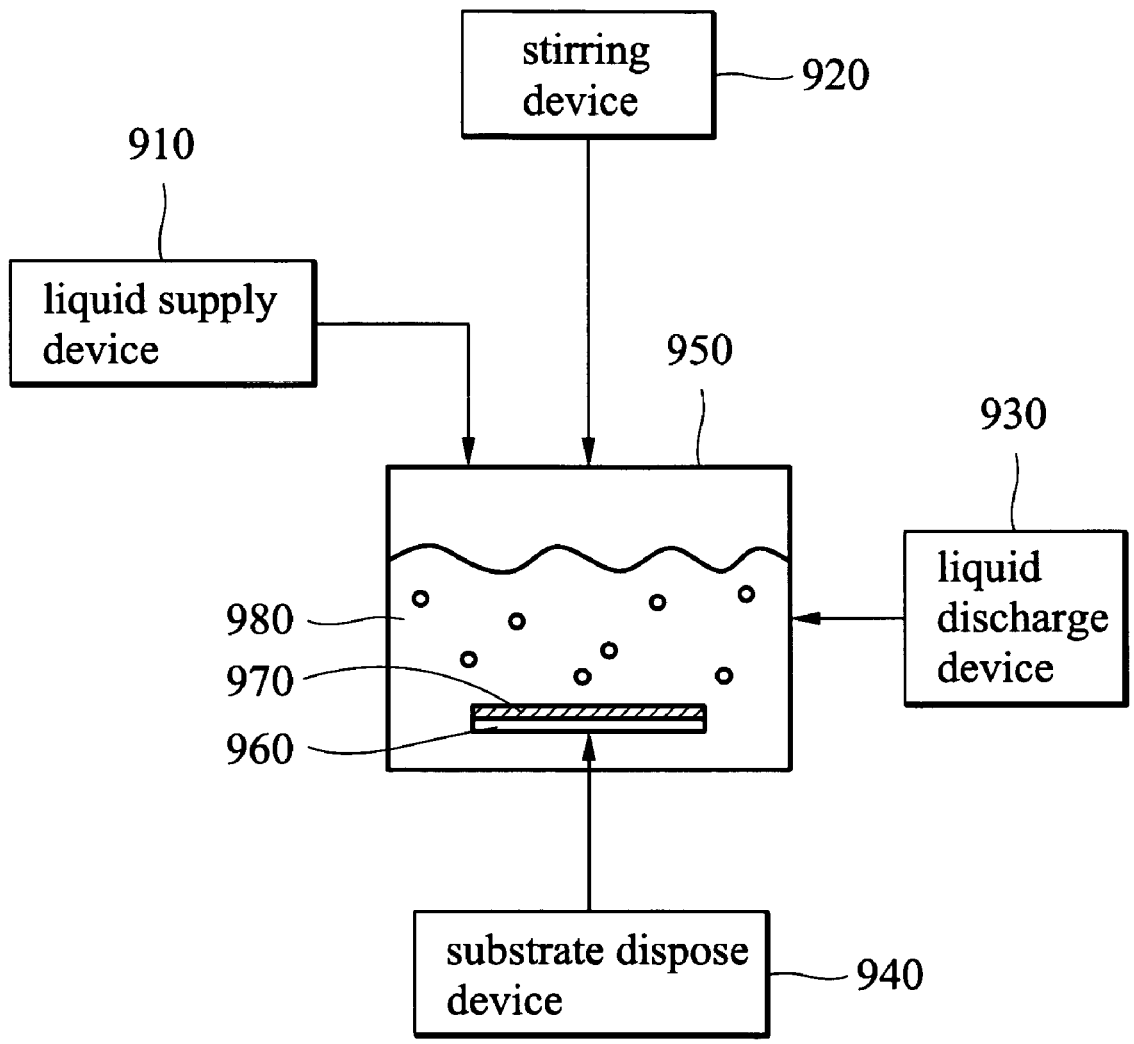
FIG. 9 is a scheme showing an embodiment of a fabrication system for the light source device.

Referring to FIG. 9, the present embodiment discloses a fabrication system for an emitting device. The fabrication system comprises a container 950; a disposal device 940 for disposing a substrate 960 into the container 950; a liquid supply device 910 for infusing liquid 980 to the container 950 and the liquid 980 is higher than the substrate 960; a stirring device 920 for mixing a plurality of light emitting powder and the liquid 980 to form a mixture, and the liquid 980 is optionally free of adhesive; a liquid discharge device 930 for removing the liquid 980 after the luminescent powders are deposited on the substrate 960. The luminescent powders are coagulated and adhered on the substrate 960 to form the luminescent powder layer 970.

Fabrication Method for Light Emitting Device

By the above-mentioned fabrication system, the present embodiment provides a light emitting semiconductor device, as shown in the FIG. 6B. The plurality of the luminescent powders are disposed on the optical path of the light emitting semiconductor device, such as on the surface of chip 120. The distance of the luminescent powders are decreased to enhance the intermolecular attraction of the luminescent powders to coagulate the luminescent powders to form the luminescent powder layer 130.

The luminescent powder layer 130 forming steps are as follows: a plurality of the luminescent powders is mixed with a liquid. The plurality of the luminescent powders is then positioned on the optical path of the semiconductor chip or wafer 120. The liquid is removed to coagulate the luminescent powders to a luminescent powder layer.

In the present embodiment, the liquid comprises water or volatile solvents and does not comprise epoxy or glue. The volatile solvents comprise the group consisting of ethers, alcohols and ketones, such as ether, methanol, ethanol or acetone.

The light emitting semiconductor chip or wafer is put into a container 950 containing the liquid 980, and the luminescent powders are dispersed in the liquid to form a mixture.

To increase the uniformity of the luminescent powders on the semiconductor chip or wafer 960, the luminescent powder depositing time may optionally increase. The height of the liquid 980 is higher than the semiconductor chip or wafer 960, so that the luminescent powders can be deposited on the semiconductor chip or wafer 960. Preferably, the height of the liquid 980 is about 3.5~6 times the height of the semiconductor chip or wafer 960.

Baking Step

In same embodiments, the liquid removing step may be a baking step. The baking step comprises a baking temperature to remove the liquid. Agitation caused by the baking temperature is controlled to not affect the arrangement of the luminescent particles on the light emitting semiconductor chip or wafer.

The baking temperature is typically higher than the room temperature. Preferably, the baking temperature is about 40~300° C. For example, the ethanol baking temperature is about 80° C. Furthermore, the baking step may comprise multiple steps. For example, the liquid is removed at a first temperature and a second temperature.

The liquid removal step further is executed before the baking step. The liquid removal step may comprise a drainage step or a pumping step.

Referring again to FIG. 6A, a plurality of luminescent powders are mixed with a liquid. The luminescent powders are then deposited on the optical path zone OP and the non-optical path zone NOP of the semiconductor wafer. After the liquid is removed, the luminescent powders are coagulated to a luminescent powder layer. Furthermore, a first passivation layer 140 is formed to protect the luminescent powder layer 130 on the optical path zone OP of the semiconductor wafer, as shown in FIG. 6A. When the luminescent powder layer on the non-optical path zone NOP of the semiconductor wafer is washed or removed, the luminescent powder layer on the optical path zone OP of the semiconductor wafer is protected by the passivation layer 140. After the luminescent powder layer on the non-optical path zone NOP of the semiconductor wafer is removed, a second passivation 150 may be formed to cover the first passivation layer 140 and the luminescent powder layer.

The following illustrates the LED fabrication by the fabrication system for emitting device.

LED Fabrication Method

First, the luminescent powders are put into the liquid, and the density of luminescent powders are higher than the density of the liquid, and the luminescent powders are insoluble or have low solubility in the liquid, and the luminescent powders are stable in the liquid and have no chemical reaction with the liquid. The luminescent powders are well mixed with the liquid by a stirring bar or ultrasonic agitation to form a mixture. The luminescent powders may be phosphors, and the phosphors may be sulfide phosphors or non-sulfide phosphors. The sulfide phosphors further may be coated by a coating film, such as organic polymer coating film, to prevent the environmental factors, such as humidity and oxygen. The non-sulfide phosphors may be YAG, TAG or any other phosphors.

A substrate is put in the mixture for a period of time, and the height of the mixture must be higher than the substrate top surface of at least 10 µm. Then the luminescent powders deposit on the substrate by gravity naturally. Thus, the density of the luminescent powders must be higher than the liquid, or the deposition will not occur. The particle size of the luminescent powders are typically 0.1~100 µm. If the particles are too small, the deposition time will be too long and the output would decrease. If the particles are too big, the uniformity of the luminescent powder layer will decrease. To achieve in luminescent powder layer thickness uniformity, the concentration of the luminescent powders and the liquid is about 0.001~1 g/ml, preferably 0.01~15 g/ml. If the concentration is too high, the luminescent powders are wasted or the luminescent powder layer will be too thick. If the concentration is too low, the deposition time will be too long and the luminescent powder layer will be too thin.

Finally, the liquid is removed by baking, drainage and/or pumping to form a luminescent powder layer on the substrate. The liquid removing step must not agitate the luminescent powder layer, or the ideal luminescent powder layer can not be obtained. The baking temperature may be 40~300° C. If the baking temperature is too low, the baking time would be too long or the liquid is difficult to dry. If the baking temperature is too high, the substrate and/or the luminescent powders can be spoiled, and the luminescent powder layer can be agitated. When the liquid is removed, the distance between the luminescent powders decrease, and the luminescent powder layer is formed by the intermolecular force, such as Van der Waal force. Furthermore, the baking step may comprise multiple baking steps, such as a first baking step and a second baking step. In the first baking step, the baking temperature may be lower than the liquid boiling point to prevent voids from forming on the luminescent powder layer surface. In the second baking step, the baking temperature may be higher to dry all the liquid and lower than the substrate or the luminescent powder spoiling temperature, 300° C. for example.

Furthermore, a passivation layer may be formed on the luminescent powder layer by a coating method. The passivation layer may be organic polymer.

In the above fabrication method, if the luminescent powders are soluble in the liquid, the luminescent powder layer will not be formed. When the luminescent powders are soluble in the liquid, if the mixture is over-saturated, the invention will still work. The overdose luminescent powder method increases the cost. Otherwise, if the luminescent powders are unstable in the liquid or have a chemical reaction with the liquid, the luminescent powders will deteriorate or decompose. Accordingly, the liquid preferably is insoluble, barely soluble, stable and has no chemical reaction with the luminescent powders. The liquid may be water, alcohols, ketones and/or ethers. The alcohols may be ethanol, the ketons may be acetone, the ethers may be ether.

Furthermore, the substrate may be an LED chip or any layer of the LED chip, in other words, the luminescent powder layer is formed on any surface of the LED chip.

The following examples provide the water and ethanol as the liquid.

Example 1

YAG phosphors produced by Nichia Co. were put in water to form a mixture by ultrasonic agitation. GaN chip was put in the mixture for about 20 min for the YAG phosphors deposition. The mixture surface was higher than the GaN chip top surface, so that the YAG phosphors deposited on the GaN chip. The water was evaporated at about 50° C. for a period, and then dried at about 200° C. to dry all the water and coagulate the YAG phosphors. In the water removing step, a vacuum process may be processing to increase the water removing rate.

Example 2

YAG phosphors produced by Nichia Co. were put in ethanol to form a mixture via ultrasonic agitation. GaN chip was put in the mixture and stayed about 20 min for the YAG phosphors deposition. The mixture surface was higher than the GaN chip top surface, so that the YAG phosphors deposited on the GaN chip. The ethanol was evaporated at about 80° C. for a period, then dried at about 150° C. to dry all the ethanol and coagulate the YAG phosphors. In the ethanol removing step, a vacuum process may be processing to increase the ethanol removing rate.

LED measurement data, CIE Coordinates and Brightness are given in the following. The LEDs are fabricated by the conventional method where the phosphor is mixed with resin and the inventive method, and use GaN LED chip and YAG phosphors. The driving conditions are as follows:

(Driving Condition 1)
Excited wavelength: 460~465 nm
Power: 40~50 mcd
Voltage: 3.2~3.3 V
(Driving Condition 2)
Excited wavelength: 470~475 nm
Power: 40~50 mcd
Voltage: 3.2~3.3 V

TABLE 1

| LED No. | CIE Coordinates | | | |
|---|---|---|---|---|
| | Driving Condition 1 | | Driving Condition 2 | |
| Fabrication Method | Conventional method | Present Invention | Conventional method | Present Invention |
| 1 | X = 0.28<br>Y = 0.28 | X = 0.28<br>Y = 0.28 | X = 0.36<br>Y = 0.32 | X = 0.28<br>Y = 0.28 |
| 2 | X = 0.30<br>Y = 0.26 | X = 0.28<br>Y = 0.28 | X = 0.38<br>Y = 0.34 | X = 0.28<br>Y = 0.28 |
| 3 | X = 0.29<br>Y = 0.27 | X = 0.28<br>Y = 0.28 | X = 0.42<br>Y = 0.36 | X = 0.28<br>Y = 0.28 |
| 4 | X = 0.24<br>Y = 0.24 | X = 0.28<br>Y = 0.28 | X = 0.36<br>Y = 0.38 | X = 0.28<br>Y = 0.28 |
| 5 | X = 0.27<br>Y = 0.25 | X = 0.28<br>Y = 0.28 | X = 0.38<br>Y = 0.33 | X = 0.28<br>Y = 0.28 |

TABLE 2

| LED No. | Brightness | | | |
|---|---|---|---|---|
| | Driving Condition 1 | | Driving Condition 2 | |
| Fabrication Method | Conventional method | Present Invention | Conventional method | Present Invention |
| 1 | 8800 mcd | 9500 mcd | 3500 mcd | 8500 mcd |
| 2 | 9400 mcd | 10500 mcd | 3200 mcd | 8000 mcd |
| 3 | 9200 mcd | 10200 mcd | 2700 mcd | 7500 mcd |
| 4 | 9800 mcd | 12100 mcd | 4000 mcd | 9500 mcd |
| 5 | 9500 mcd | 11200 mcd | 3700 mcd | 9000 mcd |

From the Table 1 and 2, LEDs of the examples emit white and brighter light. Accordingly, the light intensity of the LEDs that are fabricated by the invention and excited by the longer wavelength (lower energy) is close to the light intensity of the LEDs that are fabricated by the known and excited by the shorter wavelength (larger energy). It shows the LEDs of the invention have a better optical-electrical transfer rate.

The advantages of light emitting device and fabrication method according to the above embodiments are as follows:

1. The luminescent powder layer may be adhered in or on the light emitting semiconductor device directly free of any medium, such as epoxy or glue, so the applied energy is not wasted by the medium and the light emitting device has higher emission efficiency.

2. The luminescent powder layer may be fabricated by the direct adhesion method, and not mixed with the resin and than coated no the light emitting device. Thus the fabrication method of the invention is simpler and can enhance the output.

3. The luminescent powder layer may be fabricated by the direct adhesion method, not by mixing with the resin then coating the light emitting device, thus non-uniformity of the luminescent powder in the medium dose not occur.

4. The luminescent powder layer may be fabricated by the direct adhesion method, when this fabrication fails, the luminescent powder layer can be reworked by a brushing method, for example. So the rework is very easy and the cost is low.

While the invention has been described by way of example and in terms of preferred embodiment, it is to be understood that the invention is not limited thereto.

What is claimed is:

1. A light emitting device fabrication method, comprising:
   providing a light emitting semiconductor wafer;
   defining an optical path zone corresponding to the light emitting semiconductor wafer on or above an upper surface thereof, and a non-optical path zone adjacent the optical path zone;
   forming a luminescent powder layer over an entire surface of the light emitting semiconductor wafer comprising the optical path zone and the non-optical path zone;
   forming a passivation layer to cover the luminescent powder layer over the optical path zone, to protect the underlying luminescent powder layer in the optical path zone from subsequently being removed; and
   after forming the passivation layer, removing the luminescent powder layer over the non-optical path zone and leaving the passivation layer and the luminescent powder layer over the optical path zone corresponding to the light emitting semiconductor wafer.

2. The light emitting device fabrication method as claimed in claim 1, wherein the passivation layer serves as a stress buffer layer over the luminescent powder layer.

3. The light emitting device fabrication method as claimed in claim 2, further comprising conformably forming a protection layer over the stress buffer layer.

4. The light emitting device fabrication method as claimed in claim 3, wherein the protection layer is thicker than the stress buffer layer.

5. The light emitting device fabrication method as claimed in claim 3, wherein the protection layer is harder than the stress buffer layer.

6. The light emitting device fabrication method as claimed in claim 1, wherein a main portion of the luminescent powder layer is coagulated and adhesive material free.

7. The light emitting device fabrication method as claimed in claim 6, wherein the main portion of the luminescent powder layer comprises a plurality of luminescent particles which are coagulated by attraction of molecular interaction.

8. The light emitting device fabrication method as claimed in claim 1, wherein forming the luminescent powder layer comprises:
dispersing a plurality of luminescent particles in a liquid to form a mixture;
positioning the mixture over the light emitting semiconductor wafer for a period of time such that the luminescent particles precipitate thereover;
removing the liquid to coagulate the luminescent particles as a luminescent powder layer over the light emitting semiconductor wafer.

9. The light emitting device fabrication method as claimed in claim 1, wherein forming a luminescent powder layer over the optical path zone comprises a non-electrophoresis based method.

10. The light emitting device fabrication method as claimed in claim 8, wherein removing the liquid comprises performing a baking step with a baking temperature.

11. The light emitting device fabrication method as claimed in claim 1, wherein the light emitting semiconductor wafer comprise a plurality of chip upper surfaces and the optical path zone is thereon or above.

12. The light emitting device fabrication method as claimed in claim 11, wherein the non-optical path zone is adjacent the plurality of chip upper surfaces.

13. A light emitting device fabrication method, comprising:
providing a substrate with a plurality of light emitting semiconductor chips thereon or above;
defining an optical path zone on or above the light emitting semiconductor chips and a non-optical path zone between two light emitting semiconductor chips;
forming a luminescent powder layer over an entire surface of the substrate comprising the optical path zone and the non-optical path zone;
forming a passivation layer to cover the luminescent powder layer over the optical path zone, to protect the underlying luminescent powder layer in the optical path zone from subsequently being removed; and
after forming the passivation layer removing the luminescent powder layer over the non-optical path zone and leaving the luminescent powder layer over the optical path zone corresponding to the light emitting semiconductor chips.

14. The light emitting device fabrication method as claimed in claim 13, wherein a main portion of the luminescent powder layer is coagulated and adhesive material free.

15. The light emitting device fabrication method as claimed in claim 13, wherein forming the luminescent powder layer comprises:
dispersing a plurality of luminescent particles in a liquid to form a mixture;
positioning the mixture over the substrate; and
removing the liquid to coagulate the luminescent particles as a luminescent powder layer over the substrate.

16. The light emitting device fabrication method as claimed in claim 15, wherein removing the liquid comprises performing a baking step with a baking temperature.

17. A light emitting device fabrication method, comprising:
providing a substrate with a plurality of light emitting semiconductor chips;
defining an optical path zone corresponding to the light emitting semiconductor chips and a non-optical path zone between two light emitting semiconductor chips;
forming a luminescent powder layer over a surface of the substrate comprising the optical path zone and the non-optical path zone, wherein a main portion of the luminescent powder layer is coagulated and adhesive material free;
forming a passivation layer to cover the luminescent powder layer over the optical path zone, to protect the underlying luminescent powder layer in the optical path zone from subsequently being removed; and
after forming the passivation layer, removing the luminescent powder layer over the non-optical path zone and leaving the luminescent powder layer over the optical path zone corresponding to the light emitting semiconductor chips.

18. The light emitting device fabrication method as in claim 1, wherein the light emitting semiconductor wafer emits light to the luminescent powder layer at the optical path zone.

19. The light emitting device fabrication method as in claim 13, wherein the light emitting semiconductor chips emit light to the luminescent powder layer at the optical path zone.

20. The light emitting device fabrication method as in claim 17, wherein the light emitting semiconductor chips emit light to the luminescent powder layer at the optical path zone.

* * * * *